United States Patent [19]

Harigaya et al.

[11] 3,928,095

[45] Dec. 23, 1975

[54] SEMICONDUCTOR DEVICE AND PROCESS FOR MANUFACTURING SAME

[75] Inventors: Hiroshi Harigaya, Suwa; Masao Kanai, Shimosuwa; Toshio Kano, Suwa, all of Japan

[73] Assignee: Kabushiki Kaisha Suwa Seikosha, Tokyo, Japan

[22] Filed: July 26, 1974

[21] Appl. No.: 492,109

Related U.S. Application Data

[63] Continuation-in-part of Ser. No. 304,699, Nov. 8, 1972, abandoned.

[52] U.S. Cl. ................ 148/188; 148/190; 148/187; 148/33; 357/7; 252/62.3 E

[51] Int. Cl.² ............................................ H01L 7/34

[58] Field of Search .............. 148/188, 190, 175, 33

[56] References Cited

UNITED STATES PATENTS

| | | | |
|---|---|---|---|
| 3,387,358 | 6/1968 | Heiman | 148/188 X |
| 3,460,007 | 8/1969 | Scott | 148/188 X |
| 3,573,115 | 3/1971 | Topas | 148/188 X |
| 3,664,896 | 5/1972 | Duncan | 148/188 X |

*Primary Examiner*—Ozaki, G.

*Attorney, Agent, or Firm*—Blum Moscovitz Friedman & Kaplan

[57] ABSTRACT

A silicon substrate is coated with a layer of polycrystalline silicon containing a selected quantity of dopant. The combination is heated to cause diffusion of the dopant from the film into the substrate. The polycrystalline coating of silicon may contain more than one dopant. The product is a semiconductor device including crystalline silicon doped to a concentration of $10^{14}$ to $10^{17}$ protected by a layer of polycrystalline silicon.

10 Claims, 10 Drawing Figures

SEMICONDUCTOR DEVICE AND PROCESS FOR MANUFACTURING SAME

CROSS REFERENCE TO RELATED APPLICATION

The present application is a continuation-in-part of the application having the Ser. No. 304,699 filed Nov. 8, 1972, now abandoned.

BACKGROUND OF THE INVENTION

At the present time a variety of techniques are used for introducing an impurity or dopant into a silicon substrate. In one method, a liquid impurity source such as $BBr_3$ or $PCl_3$ is led into a reaction furnace by a carrier gas, the furnace containing oxygen. The impurity source reacts with oxygen to form compounds such as $B_2O_3$ or $P_2O_5$ which deposit on the substrate. The impurities then diffuse into the silicon substrate from the impurity oxide film.

Another technique is to form an oxide film by use of a low-temperature chemical vapor deposit (CVD), the oxide film being doped with the requisite impurities. Other techniques are to use solid diffusion sources such as BN or gaseous diffusion sources such as $PH_3$ or $B_2H_6$.

Disadvantages of the above techniques are that it is necessary to provide a mask on such portions of the silicon substrate which are to be protected from doping and that it is difficult to carry out diffusion at low concentrations, specifically, where the desired surface concentration is $10^{14}/cm^3$ to $10^{17}/cm^3$. With respect to doping by means of a silicon oxide film containing the desired impurities, a segregation phenomenon occurs, so that it is difficult to carry out diffusion at high concentrations, and since the degree of segregation differs with the diffusion temperature, it is difficult to control the process with sufficient precision so as to obtain a uniform output.

Topas (U.S. Pat. No 3,573,115) has disclosed a procedure in which oxygen, a dopant-containing gas such as diborane and an inert gas are used to treat wafers first at about 950°C and then at about 1250°C. No source of silicon is included. According to Topas the borane is decomposed at the lower temperature to deposit boron, and simultaneous oxidation of the silicon substrate and diffusion of boron into the substrate occur at the higher temperature. It will be noted that diffusion therefore takes place from a deposit of boron and not from polycrystalline silicon. Also, it is not explained why the diborane is not attacked by the oxygen at 950°C and converted to $B_2O_3$.

Heiman (U.S. Pat. No. 3,387,358) has disclosed diffusion of the doping impurity from heavily doped $SiO_2$, but, as aforenoted, a segregation phenomenon arises so that it is difficult to make reliable semiconductors with closely reproducible characteristics by such a process.

The range of $10^{14}/cm^3$ to $10^{17}/cm^3$ is particularly suitable for semiconductor devices except for the fact that in making metal contacts Schottky junctions are formed. Semiconductor devices in which the impurity content in the substrate is lower than $10^{14}$ atoms/cm$^3$ are less valuable, due, largely, to the fact that the conductivity is low. Conversely, at concentrations in the range of $10^{18}$ atoms and higher the crystallizability of the polycrystalline silicon layer from which diffusion into the substrate is to be carried out is poor, leading to the occurrence of pinholes and inferior electrical characteristics.

For the reasons given, the range $10^{14}$ to $10^{17}$ impurity atoms/cm$^3$ in a semiconductor device utilizing a silicon substrate is particularly desirable, but thus far, methods of formation providing the requisite degree of control over the impurity concentration as well as the necessary electrical and contact characteristics have been inadequate.

SUMMARY OF THE INVENTION

A coating of polycrystalline silicon containing dopant elements is prepared by bringing silane and a hydride of one or more dopant elements into contact with exposed portions of a substrate of silicon heated to between 500°and 700°C, the remainder of the surface being protected by a film of $SiO_2$. Polycrystalline silicon with one or more dopant elements is deposited as a coating on the substrate as well as on the $SiO_2$ film. The coated silicon is subsequently heated to a temperature high enough to cause diffusion of the dopant from the polycrystalline coating into the silicon substrate. The coating may be converted into oxide by heating in an oxygen-containing atmosphere either during or subsequent to the diffusion step. Control of the quantity of dopant in the coating is effected by controlling the ratio of dopant hydride to silane in the gas from which the coating is deposited.

Accordingly, it is an object of the present invention to provide an improved method of doping silicon substrate in a selected pattern from a polycrystalline silicon deposit containing impurities at a selected concentration level.

Another object of the present invention is to provide an improved method of preparing doped silicon wherein a coating of polycrystalline silicon is deposited on a silicon substrate, said silicon substrate and its coating are heated to cause diffusion of dopants from said coating into said substrate, and the combination is finally heated in oxygen to cause conversion of at least part of said polycrystalline silicon into an oxide.

A further object of the present invention is to provide an improved method of preparing a semiconductor device including a doped silicon substrate in which a polycrystalline coating containing one or more dopants is formed on the surface of said silicon substrate by thermal decomposition from silane and from impurity hydrides where the impurity concentration in the substrate is in the range of $10^{14}$ to $10^{17}$ atoms/cm$^3$, and to which effective ohmic contacts can readily be made.

Still another object of the present invention is to provide an improved method of doping a silicon substrate wherein the formation of a coating of silicon containing a selected proportion of dopants and the step of causing diffusion of dopants from the coating into the substrate are carried out separately.

Yet another object of the invention is a doped silicon substrate having an impurity concentration in the range of $10^{14}$ to $10^{17}$ atoms/cm$^3$ to which ohmic metallic contacts can readily be formed.

Still other objects and advantages of the invention will in part be obvious and will in part be apparent from the specification.

The invention accordingly comprises the several steps and the relation to one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWING

For a fuller understanding of the invention, reference is had to the following description taken in connection with the accompanying drawing.

DESCRIPTION OF THE PREFERRED EMBODIMENTS

The method of the present invention can be used for diffusion of impurities into either n-type silicon substrates or into p-type silicon substrates. The method will be described with reference to the n-type material, but the modifications of the process necessary for use with p-type silicon will also be indicated.

Figure 1:
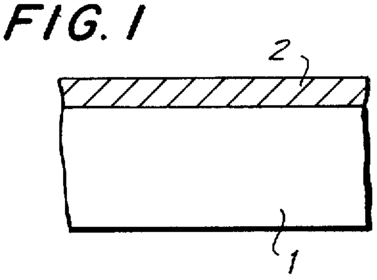
FIG. 1 is a silicon substrate covered with a coating of $SiO_2$.
Figure 2:
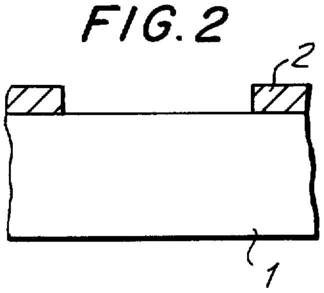
FIG. 2 shows the device of FIG. 1 with an etched opening in the $SiO_2$ coating.

The n-type silicon substrate should have a resistivity in the range of 0.2 to 300 ohms-cm, and a particularly desirable resistivity is about 100 ohm-cm. Such a material is thermally oxidized in wet oxygen. The higher the ratio of water to oxygen, the greater will be the speed of growth of the oxide film on the silicon. Suitable conditions are oxidation at 950° to 1250°C for 5 to 240 minutes, depending on the thickness of the film desired. Suitable partial pressures for the reactants are 1 kg/cm² for $H_2O$ and 2 kg/cm² for $O_2$. A convenient film thickness is 6000 A. FIG. 1 shows schematically an n-type Si substrate 1 having a coating 2 of $SiO_2$ thereon.

In preparation for deposition of a layer of polycrystalline silicon openings are formed in $SiO_2$ film 2 by conventional techniques such as the photolithographic process.

A critical step in the present process is the deposition of a film of polycrystalline silicon containing the desired level of impurity. Where the impurity is to be boron at a concentration of $10^{14}$ to $10^{17}$ atoms /cm³, the reactants may be approximately as shown in the following table:

| | |
|---|---|
| $N_2$ (or other inert gas) | 12 liters |
| 2% $SiH_4$ in $N_2$ | 0.5 liter |
| 5ppm $B_2H_6$ in $N_2$ | 0.1 liter |

It will be noted that this composition amounts to about 0.08 mol% of $SiH_4$ and 40 parts per billion (ppb) of $B_2H_6$ in $N_2$ or other inert gas atmosphere. To cover the range of $10^{14}$ to $10^{17}$ impurity atoms/cm³ in the substrate, the concentration of borane may be varied from about 2 to 2000 ppb. Using 5 ppm $B_2H_6$ in $N_2$, the quantity of this mixture required would be between 0.005 and 5 liters. For the introduction of phosphorous into the substrate the concentration of phosphine (in volume or mol fraction) should be roughly double that of borane because each molecule contains only one phosphorous atom as against two boron atoms in borane.

Figures 3, 4, 5, 6, 7, 9:
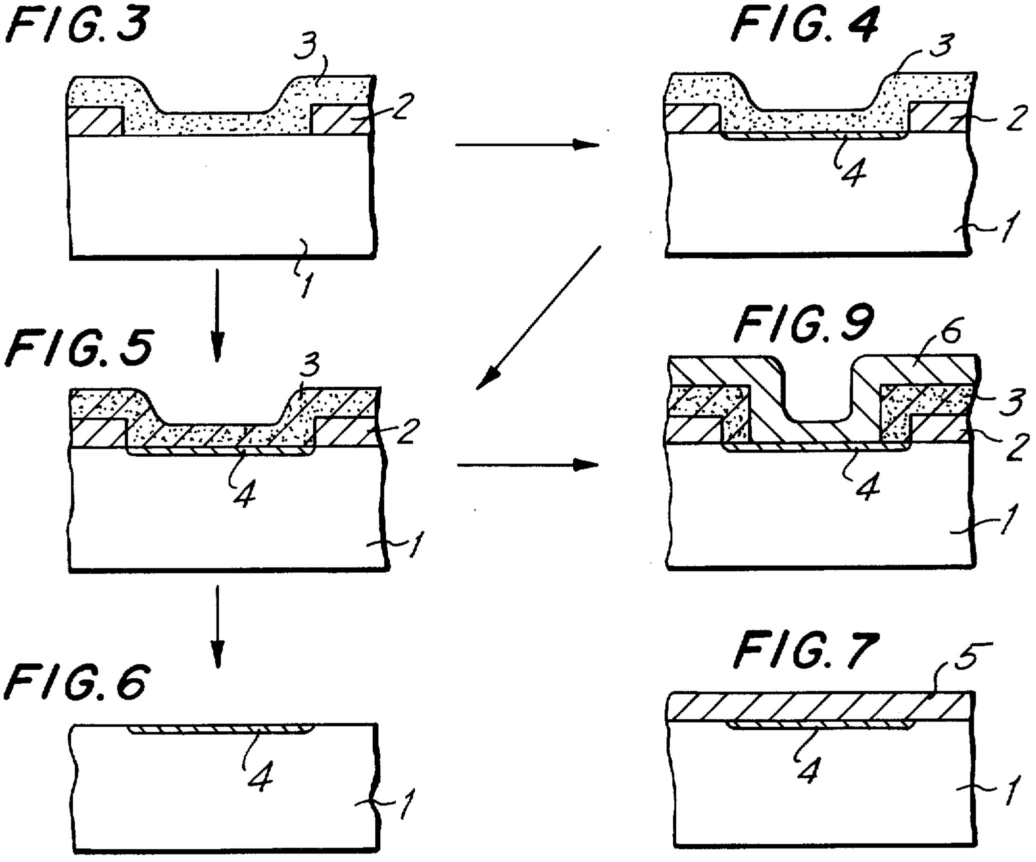
FIG. 3 is the device after coating with doped polycrystalline Si.
FIG. 4 is the device after diffusion of impurity from the polycrystalline Si into the substrate.
FIG. 5 is the device after conversion of the polycrystalline Si into $SiO_2$.
FIG. 6 is the substrate after removal of all $SiO_2$.
FIG. 7 is the device with a new coating of $SiO_2$.
FIG. 9 represents the device at the stage of FIG. 5 after etching a pattern of openings and making metallic contact through Si openings.

High purity materials are used throughout and the reaction is carried out in an enclosure into which the gases are introduced in the ratio corresponding to the quantities shown in the right-hand column of the above table. The reaction in which the doped polycrystalline silicon is deposited is carried out at a temperature between 500° and 700°C, and the time of reaction, depending on the desired thickness of the polycrystalline silicon layer, is from 2 to 40 minutes. Under these conditions, the thickness of the polycrystalline silicon layer is controlled to lie between 500 to 10,000 A. The device at this stage is shown in FIG. 3 where the doped polycrystalline silicon layer has the reference number 3. It is important that the reaction temperature not be allowed to rise substantially over 700°C since otherwise diffusion of the dopant into the substrate 1 will occur during formation of the polycrystalline Si layer.

The usual procedure at this stage is to heat the device in order to form infiltrated layer 4 as shown in FIG. 4 and then to oxidize the polycrystalline silicon layer 3 to convert it to silicon dioxide as shown in FIG. 5. However, in accordance with the present process, the device may be heated to a temperature between 900° and 1250°C and held there for between 5 and 60 minutes for simultaneous oxidation of the silicon layer and diffusion of the boron into the substrate. A suitable atmosphere for the oxidation reaction consists of 1.8 liters of nitrogen and 0.2 liters of oxygen. As indicated in the drawing, the device is taken from the stage represented in FIG. 3 directly to the stage represented in FIG. 5 without passing through the stage represented by FIG. 4.

Figure 8:
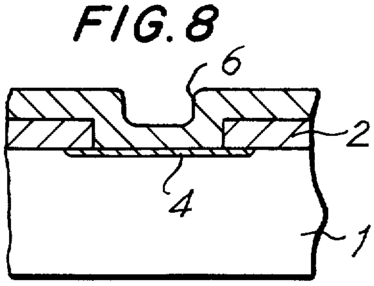
FIG. 8 is the device after etching of a pattern of openings and making metallic contact with the substrate through openings in the $SiO_2$ coating.

At this point, the silica layer 3 may be etched by the usual techniques to provide an opening to diffused layer 4 through which metallic contact can be made as shown in FIG. 9. However, diodes made according to this procedure are not as reliable as might be desired due to the large step or depression in metallic layer 6 shown in FIG. 9. Preferably, silica layers 2 and 3 are removed so that only substrate 1 containing diffusion layer 4 remains as shown in FIG. 6. A CVD layer of silica may then be deposited as indicated by the reference number 5 in FIG. 7. An opening to provide access for a contact to diffusion layer 4 is then formed by etching, and metal layer 6 is deposited in the form shown in FIG. 8. It will be noted that the depth of the depression over diffusion layer 4 is much smaller than in the embodiment of FIG. 9. Due to the fact that the diffusion constants for phosphorous and for boron in silicon are approximately the same, the method of diffusion of phosphorous is the same as for boron. Of course, the phosphorous is generally diffused into p-type silicon.

Also, phosphine ($PH_3$) is used instead of diborane in the reaction mixture for producing phosphorous doped polycrystalline silicon.

As aforenoted, the impurity range of $10^{14}$ –$10^{17}$ is particularly desirable. This follows for a number of reasons. Assuming a difference in the work function between the semiconductor in the metal used as a contact, and particularly when the work function of the metal is larger, a wall is generated in the contact region so that electrons are prevented from flowing from the metal to the semiconductor, and electrons flow only in the reverse direction. Consequently, the contact between the metal and the substrate constitutes a type of diode. However, when the impurity concentration is sufficiently high, despite the presence of this wall, the electrons can flow in both directions owing to the tunnel effect, so that an ohmic contact can be obtained. This is one reason why the impurity concentration must be at least about $10^{14}$.

Figure 10:
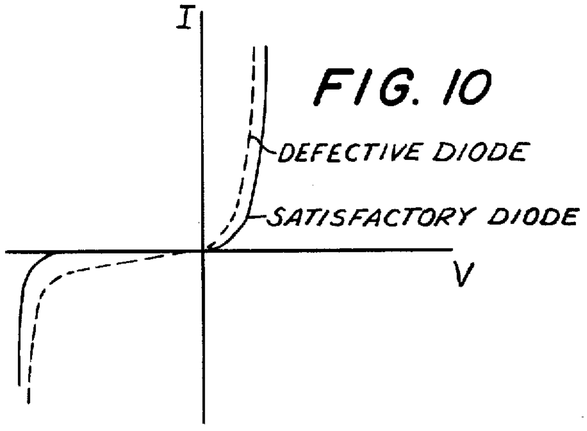
FIG. 10 is a graph showing in arbitrary units characteristic curves for defective and for satisfactory diodes the latter being prepared in accordance with the present invention.

When impurity atoms such as boron and phosphorous are introduced into silicon by means of diffusion, they take up positions at the lattice points or within the lattice of silicon as infiltration type impurities or substitution type impurities. In the process of forcibly infiltrating or substituting at positions in the lattice, large distortions are generated as a result of which lattice defects either of the dislocation or the slip type are readily generated. As a consequence, defects are generated in the wall at the p-n junction and the diode characteristic is influenced unfavorably. This introduces the possibility of leakage current. This is illustrated in FIG. 10 which shows that a leakage current, even at small reverse voltages, is present.

As aforenoted, the simultaneous oxidation of the polycrystalline silicon layer and diffusion from said layer into the silicon substrate is a critical operation. If the oxidation takes place too rapidly so that the layer is oxidized before completion of the diffusion step, then the segregation phenomenon will occur preventing introduction of the dopant into the substrate to the desired extent. Conversely, if the oxidation is carried out too slowly then the thickness of the diffused layer will become excessive before the polycrystalline layer is completely oxidized. The process in which both steps are carried out simultaneously is feasible because of the fact that the conversion of the polycrystalline silicon coating proceeds from the outer face of the silicon coating inwardly while the diffusion proceeds at the interface between the coating and the substrate. Consequently, the diffusion process can be closely controlled and a uniform product is obtained.

As a means of cutting costs and increasing the output, where the step of vapor oxidation of the doped polycrystalline silicon film is carried out during diffusion, the preparation of a mask of silicon oxide on the next batch of silicon substrates to be doped can be carried out at the same time.

In the preparation of semiconductor devices, and, particularly integrated circuits on a single chip, it may be necessary to use more than one dopant as well as to form gates, etc. While the process steps disclosed herein do not constitute the entire procedure in the manufacture of semiconductor devices, nevertheless the process stages disclosed herein are valuable for producing semiconductor devices requiring regions containing impurity atoms to the extent of $10^{14}-10^{17}/cm^3$ in silicon substrates. The manufacture of such circuits or devices starts with the substrate which may be in the form of a chip or wafer and proceeds through the stages in accordance with the present invention as well as subsequent steps to the fashioning of a complete integrated circuit or device.

It will thus be seen that the objects set forth above, among those made apparent from the preceding description are efficiently attained and, since certain changes may be made in carrying out the above process and in the article set forth without departing from the spirit and scope of the invention, it is intended that all matter contained in the above description and shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

We claim:

1. The improvement in a process for the formation on a silicon substrate of a surface region containing $10^{14}-10^{17}$ impurity atoms/$cm^3$ introduced by diffusion and to which reliable ohmic metallic contact can be made, wherein said improvement comprises the steps of holding a silicon substrate having an apertured film of $SiO_2$ thereon at a temperature of 500° – 700°C for a period between 2 and 40 minutes in a first atmosphere consisting of an inert gas, silane and a gaseous impurity source to form a layer of polycrystalline silicon containing the impurity from said source on said substrate and apertured film, said polycrystalline Si layer containing $10^{14}-10^{17}$ impurity atoms/$cm^3$, replacing said first atmosphere with a second atmosphere including oxygen and free of silane and said impurity source, and holding said substrate at a temperature between 900° and 1250°C for a period between 5 and 60 minutes to effect concurrent diffusion of said impurity from said polycrystalline silicon into said substrate at the aperture in said film and oxidation of said polycrystalline silicon layer to form $SiO_2$ containing said impurity.

2. The improvement as defined in claim 1 wherein said Si substrate is n-type and said impurity source is $B_2H_6$.

3. The improvement as defined in claim 1 wherein said Si substrate is p-type and said impurity source is $PH_3$.

4. The improvement as defined in claim 1 wherein said first atmosphere is introduced in a ratio corresponding approximately to 12 liters of inert gas, 2%, $SiH_4$ in 0.5 liter of inert gas and 5 ppm of $B_2H_6$ in 0.005 –5 liters of inert gas.

5. The improvement as defined in claim 1 wherein said first atmosphere is introduced in a ratio corresponding approximately to 12 liters of inert gas, 2% $SiH_4$ in 0.5 liter of inert gas and 10 ppm of $PH_3$ in 0.005 – 5 liters of inert gas.

6. The improvement as defined in claim 1, further comprising the steps of etching an opening through said layer of impurity containing $SiO_2$ to the impurity-diffused region in said substrate, and depositing metal in a controlled pattern to make contact with said impurity-diffused region.

7. The improvement as defined in claim 1, further comprising the steps of etching away said film and layer of impurity containing $SiO_2$ from said substrate, depositing a new layer of $SiO_2$ over said substrate, etching an opening through said new layer at the impurity-diffused region in said substrate and depositing metal in a controlled pattern to make contact with said impurity-diffused region.

8. The improvement as defined in claim 1 wherein said first atmosphere is introduced in a ratio corresponding approximately to 12 liters of inert gas, 2% $SiH_4$ in 0.5 liter of inert gas and 5 ppm of $B_2H_6$ in 0.1 liter of inert gas.

9. The improvement as defined in claim 1 wherein said first atmosphere is introduced in a ratio corresponding approximately to 12 liters of inert gas, 2% $SiH_4$ in 0.5 liter of inert gas and 10 ppm of $PH_3$ in 0.1 liter of inert gas.

10. A silicon substrate having a surface region containing a concentration of impurity atoms of $10^{14}-10^{17}/cm^3$, the distribution of impurity atoms with depth in said substrate being characteristic of that obtained by diffusion at a temperature between 900° and 1250°C from a polycrystalline silicon layer on said substrate, said silicon substrate having thereon a layer of silicon dioxide having a gap in registry with said surface region, and a metallic electrode making contact with said surface region.

* * * * *